United States Patent
Mulder et al.

(10) Patent No.: US 6,326,788 B1
(45) Date of Patent: Dec. 4, 2001

(54) MRI APPARATUS WITH A MECHANICALLY INTEGRATED EDDY CURRENT SHIELD IN THE GRADIENT SYSTEM

(75) Inventors: Gerardus B. J. Mulder; Cornelis L. G. Ham; Aart J. Mateboer; Nicolaas B. Roozen; Johannes P. M. Verbunt, all of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/428,765

(22) Filed: Oct. 28, 1999

(30) Foreign Application Priority Data

Oct. 28, 1998 (EP) .................................................. 98203650

(51) Int. Cl.[7] ........................................................ G01V 3/00
(52) U.S. Cl. .......................... 324/318; 324/309; 324/322
(58) Field of Search .................................. 324/318, 319, 324/322, 309

(56) References Cited

U.S. PATENT DOCUMENTS

| | | | |
|---|---|---|---|
| 4,737,716 | * | 4/1988 | Roemer et al. ...................... 324/319 |
| 5,083,085 | | 1/1992 | Morad .................................. 324/318 |
| 5,132,618 | * | 7/1992 | Sugimoto et al. .................... 324/318 |
| 5,278,502 | * | 1/1994 | Laskaris et al. ...................... 324/318 |
| 5,296,810 | * | 3/1994 | Morich ................................. 324/318 |
| 5,349,297 | | 9/1994 | De Meester et al. ................ 324/318 |
| 5,488,299 | * | 1/1996 | Kondo et al. ........................ 324/318 |
| 6,049,207 | * | 4/2000 | Petropoulos ......................... 324/318 |

* cited by examiner

Primary Examiner—Jay Patidar
Assistant Examiner—Brij B. Shrivastav
(74) Attorney, Agent, or Firm—John F. Vodopia

(57) ABSTRACT

The MRI apparatus includes an actively shielded gradient system (40) with primary gradient coils and shielding coils (56). Despite the active shielding, such a system inevitably causes a magnetic field to some extent outside the shielding, so that eddy currents are generated in the conductive structures of the main magnet, said eddy currents causing heat dissipation and annoying noise. According to the invention, the gradient system also includes an eddy current shield (48) which consists of an electrically conductive, substantially closed plate; furthermore, the primary gradient coil (60) and the shielding coil (56) are arranged within the eddy current shield (48) and these three elements together constitute a mechanically rigid unit. As a result, eddy currents are avoided in the main magnet and annoying noise is strongly reduced.

7 Claims, 2 Drawing Sheets

MRI APPARATUS WITH A MECHANICALLY INTEGRATED EDDY CURRENT SHIELD IN THE GRADIENT SYSTEM

BACKGROUND OF THE INVENTION

1. Field of the Invention

The invention relates to a magnetic resonance imaging apparatus which includes a gradient system for generating a magnetic gradient field in an imaging volume of the apparatus, which gradient system includes a primary gradient coil for generating the gradient field and a shielding coil for actively shielding the space outside the imaging volume from the magnetic field generated in said space by the primary gradient coil.

2. Description of the Related Art

An apparatus of this kind is known from U.S. Pat. No. 5,349,297

A magnetic resonance imaging apparatus for medical purposes, also referred to as MRI apparatus, is arranged to form images of cross-sections of a body. To this end, a strong, steady, uniform field is generated in a volume in such an apparatus which is intended for imaging, i.e. the so-called imaging volume. A gradient field is superposed on said uniform field in order to indicate the location of the cross-section to be imaged. The atoms in the tissue present in the imaging volume are then excited by means of an RF field; the spin resonance signal produced upon relaxation of the excited atoms is then used to reconstruct an image of the cross-section indicated by the gradient field. The steady, uniform field, also referred to as the main field, is generated by means of a coil system (superconducting or not). Together with the associated envelope this coil system is shaped as a short tube in which the imaging volume is situated. The diameter of this tube is determined by the dimensions of the patients to be examined and hence has a given minimum value, for example of the order of magnitude of 90 cm.

The gradient system for generating the magnetic gradient field in the imaging volume is arranged within said tube and around the imaging volume. The gradient system includes gradient coils for generating an associated gradient field; for each of the three co-ordinate directions it includes one set, each of which is referred to as a primary gradient coil. Thus three axial fields are produced with gradients in the three co-ordinate directions x, y and the axial direction z. Current pulses are applied to the gradient coils during the imaging process, so that inevitably magnetic stray fields are produced also outside the imaging volume.

These stray fields are capable of inducing eddy currents in the conductive parts of the apparatus which are present in the vicinity of the gradient coil, notably the metal parts provided for generating the main field, for example the tubular part of the envelope for the coil system, any thermal shields situated within the envelope (in the case of a superconducting coil system) or the coils for the main field themselves. The magnetic fields generated by the eddy currents cause distortions of the image to be formed. Moreover, they cause heat dissipation in the parts carrying the eddy current; this is a drawback notably in the case of a superconducting coil system, because the liquid helium acting as the cooling medium then boils off faster. Finally, they also cause an annoying noise in that the parts conducting the eddy current are situated in a magnetic field and hence are subject to Lorenz forces which cause deformation of said parts.

In order to counteract the above-mentioned adverse effects of the eddy currents, attempts are made to shield or compensate the magnetic fields generated outside the imaging volume by the primary coil. From the cited United States patent it is known that in order to compensate said stray fields a shielding coil is arranged around the primary gradient coil, said shielding coil being intended to provide active shielding of the space outside the imaging volume from the magnetic field generated in said space by the primary coil by compensation. Active shielding is to be understood to mean herein the shielding by generating a compensating magnetic field by means of a shielding coil other than the primary coil. Such a shielding coil can be connected in series with the primary coil or be controlled independently of the primary coil; the latter case is referred to as independent active shielding.

Even though a shielding coil for active shielding offers a substantial reduction of the stray field, in practical circumstances a given amount of stray field always remains. This can be explained in that inter alia the shielding coil is made of discrete turns and in that dimensional deviations inevitably occur due to manufacturing tolerances, so that magnetic flux can still escape, between the shielding turns, to the area surrounding the system formed by the gradient coil and the shielding coil.

Citation of a reference herein, or throughout this specification, is not to be construed as an admission that such reference is prior art to the Applicant's invention of the invention subsequently claimed.

SUMMARY OF THE INVENTION

It is an object of the invention to provide a magnetic resonance imaging apparatus of the kind set forth in which the actively shielded gradient system offers a substantial reduction of the eddy currents generated in the main field magnet and also a substantial reduction of the noise caused by the gradient system.

To achieve this, the magnetic resonance imaging apparatus according to the invention is characterized in that the gradient system also includes an eddy current shield which is formed by an electrically conductive, substantially closed plate, and that the primary gradient coil and the shielding coil are arranged within the eddy current shield and constitute a mechanically rigid unit in conjunction therewith.

Because the coil system per se already forms a more or less shielded system, the residual stray field is still small in comparison with a non-shielded situation. When the electrically conductive eddy current shield is formed from a substantially closed plate in which the two coils are arranged, the escape of magnetic flux to the environment is prevented so that said problems regarding heat dissipation and production of noise in the main field magnet are avoided.

When the gradient system thus constructed is arranged in the main field of an MRI apparatus, the main field will not exert Lorenz forces on the system as a whole. This can be readily understood, considering the fact that the system does not generate a magnetic field at the area of the main field coils, so that the system cannot exert Lorenz forces on the main field coils. However, this also means that no reactive force (i.e. a force exerted on the gradient system by the main field) can be present either. This itself means that overall the main field does not exert a force (i.e. no moving force) on the gradient system, thus eliminating this cause of annoying noise.

Finally, the two coils and the eddy current shield together form a mechanically rigid unit so that the internal forces in the gradient system constructed according to the invention (which could not cause a displacement of the system as a whole but still a distortion of this system) can cause a slight distortion only of the mechanically rigid assembly. The requirement as regards noise reduction is thus satisfied to a high degree.

Upon installation of known gradient systems it is necessary to adjust the gradient system in dependence on the specific properties of the combination formed by the gradient system and the remainder of the apparatus, notably the main field magnet. This is because of the inevitable manufacturing tolerances, notably in the frequently occurring cases where the manufacturer of the gradient system is not the manufacturer of the system. The manufacturer of the gradient system can still manufacture within the specified tolerances, but when the gradient system is built into the system different adjusting values will be required for each combination. The gradient system constructed according to the invention, however, can be adjusted by the manufacturer as one unit in such a manner that this gradient system does not exhibit a stray field or only an insignificant stray field, so that no further adjustment of the combination is required. The apparatus according to the invention, therefore, offers the additional advantage that it does not necessitate an adjusting step during final assembly of the system.

It is to be noted that U.S. Pat. No. 5,083,085 discloses a magnetic resonance apparatus which includes a shielded system of gradient coils producing a linear gradient field within the imaging volume and for shielding the imaging volume from the disturbing effects of eddy currents occurring outside the gradient system. The coil system described in the cited document consists of a first set of coils, a conductive shield which encloses the first set of coils, and a second set of coils which encloses the conductive shield. The two sets of coils and the conductive shield together form a mechanically rigid unit.

The inner coil of both these sets of coils (also referred to as the inner coil and the outer coil) produces the desired gradient field; this inner coil causes eddy currents in the conductive shield. These eddy currents are suppressed by opposing eddy currents generated in the conductive shield by the outer coil, so that the sum of these eddy currents is substantially zero.

Because the outer coil is intended to generate eddy currents which oppose the eddy currents generated by the inner coil, it will be evident to those skilled in the art that the outer coil is not intended to realize active shielding, i.e. to reduce the stray field caused by the inner coil as much as possible. The conductive shield is not intended for shielding either because, as is described in the cited document, the outer coil is driven in such a manner that the sum of the eddy currents in the shield equals zero. The effect of the outer coil on the imaging volume is very slight, because the shield shields the imaging volume from changes occurring outside the shield. The system as a whole will still produce stray fields for this reason. Moreover, the shield cannot have a shielding effect on the stray fields originating from the outer coil, so that a resultant external stray field will still be present. Those who are skilled in the art and are looking for a solution to the problem concerning the Lorenz forces and heat dissipation caused by the stray fields cannot derive technical information from said document that leads to the solution of this problem.

In an embodiment of the invention the gradient system is arranged in an evacuated space. The gradient system constructed according to the invention can be arranged in said evacuated space in a damped and/or resilient manner such that any residual vibrations in the gradient system are not passed on to the surrounding construction or only hardly so. Because there is no ambient atmosphere for transferring acoustic vibrations, therefore, this system does not cause a noise nuisance.

In another embodiment of the invention, the time constant for eddy currents of the eddy current shield is greater than the pulse duration of the gradient current pulses driving the gradient system. Such a choice of the time constant for eddy currents of the eddy current shield prevents the occurrence of noticeable damping of the eddy currents during the existence of a gradient current pulse. In such a situation it may happen that a given amount of stray field is nevertheless present outside the eddy current shield; as has already been described, such presence should be avoided. The shielding effect can thus be further optimized by such a choice of the time constant of the eddy current shield.

The eddy current shield in a further embodiment of the invention is made of aluminium and/or copper. Using this material, adequate mechanical rigidity can be readily achieved and at the same time the desired electrical properties, notably in respect of said time constant, can be achieved by means of a comparatively small amount of material.

In a further embodiment of the invention a space exists between the shielding coil and the eddy current shield, ferromagnetic shim elements being arranged in said space in order to adjust the steady, uniform magnetic field in the imaging volume of the apparatus. Generally speaking, the bore in which the patient to be imaged is to be accommodated (i.e. the tubular internal space of the main field magnet) should have an as small as possible diameter for reason of cost, i.e. it should be as close as possible to the maximum size of the patients to be examined. However, it is still necessary to arrange the gradient system around the imaging volume in this bore, so that the gradient system should have an as small as possible thickness. On the other hand, it follows from theoretical considerations that the shielding effect of the eddy current shield is optimum when a given distance exists between the outer side of the shielding coil and the inner side of the eddy current shield. The space thus formed within the gradient system can be used to accommodate the shim elements which are always present within the bore any way. Any increase of the diameter of the gradient system due to the formation of the desired space between the shielding coil and the eddy current shield will not lead to a corresponding increase of the bore when the shim elements are moved from their original location within the bore to said space.

In another embodiment of the invention a space exists between the primary gradient coil and the shielding coil; this space contains a filler medium in which ducts are provided so as to conduct a cooling liquid. It is notably when the gradient system is arranged in an evacuated space that it may be necessary to cool the various coils by means of, for example water. To this end, advantageously use can be made of the space between the primary gradient coil and the shielding coil which is often present any way for reasons of optimization of the shielding. Because the gradient system according to the invention constitutes a mechanically rigid unit, this space will be filled with a filler medium; the desired cooling ducts can then be formed therein.

BRIEF DESCRIPTION OF THE DRAWINGS

The invention will be described in detail hereinafter with reference to the Figures. Therein.

DETAILED DESCRIPTION OF THE DRAWINGS

Figure 1:
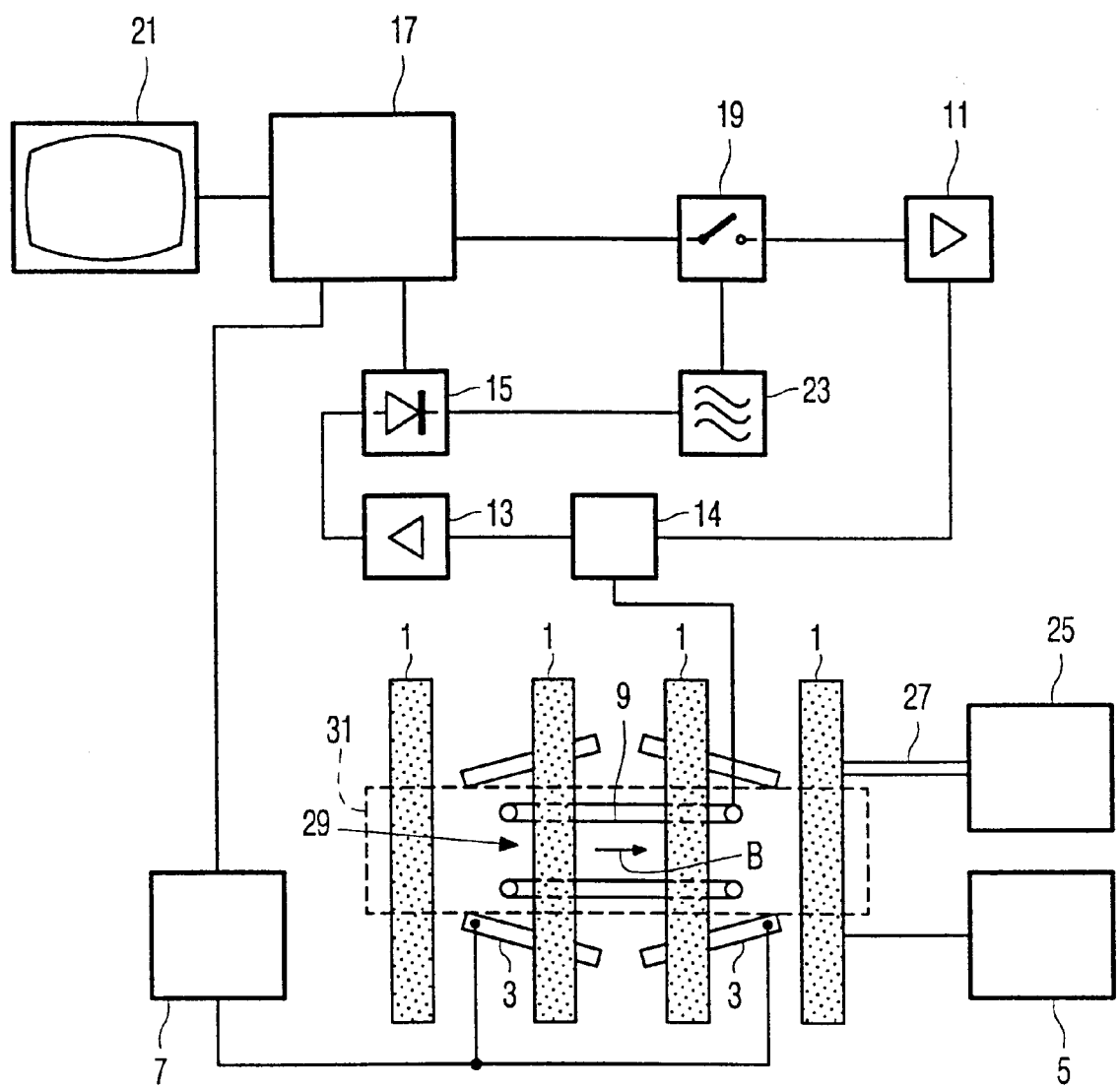
FIG. 1 shows diagrammatically the general construction of a magnetic resonance imaging apparatus.

The magnetic resonance imaging apparatus which is diagrammatically shown in FIG. 1 includes a first magnet system 1 for generating a steady, uniform magnetic field B, a second magnet system 3 (the gradient coil system) for generating magnetic gradient fields, a power amplifier 7 for the gradient coil system 3, and a power supply device 5 for the first magnet system 1. An RF coil 9 serves to generate an RF magnetic alternating field; to this end, it is connected to an RF transmitter device which includes an RF source 11. The RF coil 9 can also be used for the detection of spin resonance signals generated in an object to be examined (not shown) by the RF transmitter field; to this end, this coil is connected to an RF receiver device which includes a signal amplifier 13. The output of the signal amplifier 13 is connected to a detector circuit 15 which is connected to a central control device 17. The central control device 17 also controls a modulator 19 for the RF source 11, the power amplifier 7 and a monitor 21 for image display. An RF oscillator 23 controls the modulator 19 as well as the detector 15 which processes the measuring signals. A cooling device 25 with cooling ducts 27 serves to cool the magnet coils of the first magnet system 1. The RF coil 9, arranged within the magnet systems 1 and 3, encloses an imaging volume 29 which, in the case of an apparatus for medical diagnostic measurements, is large enough to accommodate a patient to be examined or a part of the patient to be examined, for example the head and the neck. A steady magnetic field B, gradient fields for selecting object slices, and a spatially uniform RF alternating field can thus be generated within the imaging volume 29. The RF coil 9 can combine the functions of transmitter coil and measuring coil; in that case there is provided a separating circuit 14 for separating the forward and return signal traffic. Alternatively, different coils can be used for the two functions; for example, surface coils then act as measuring coils. If desired, the coil 9 may also be enclosed by an RF field shielding Faraday cage 31.

Figure 2A:
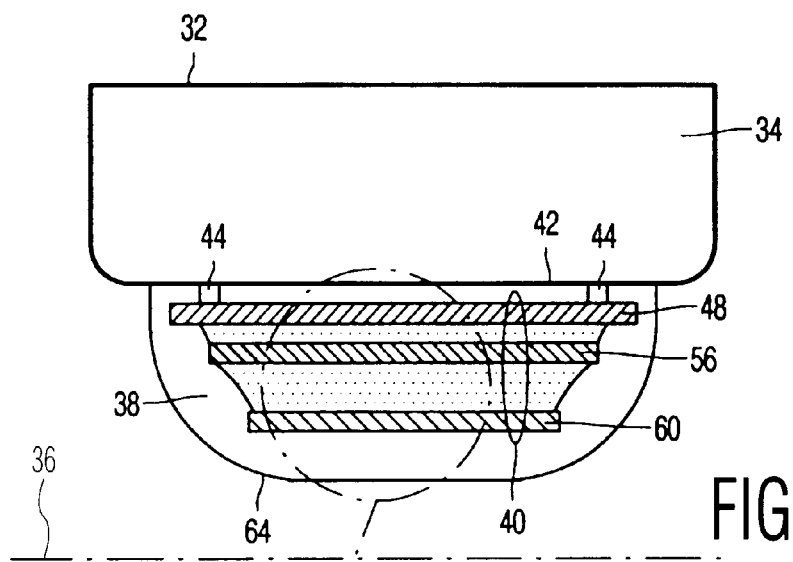
FIG. 2 shows the construction of the gradient coil system according to the invention.
Figure 2B:
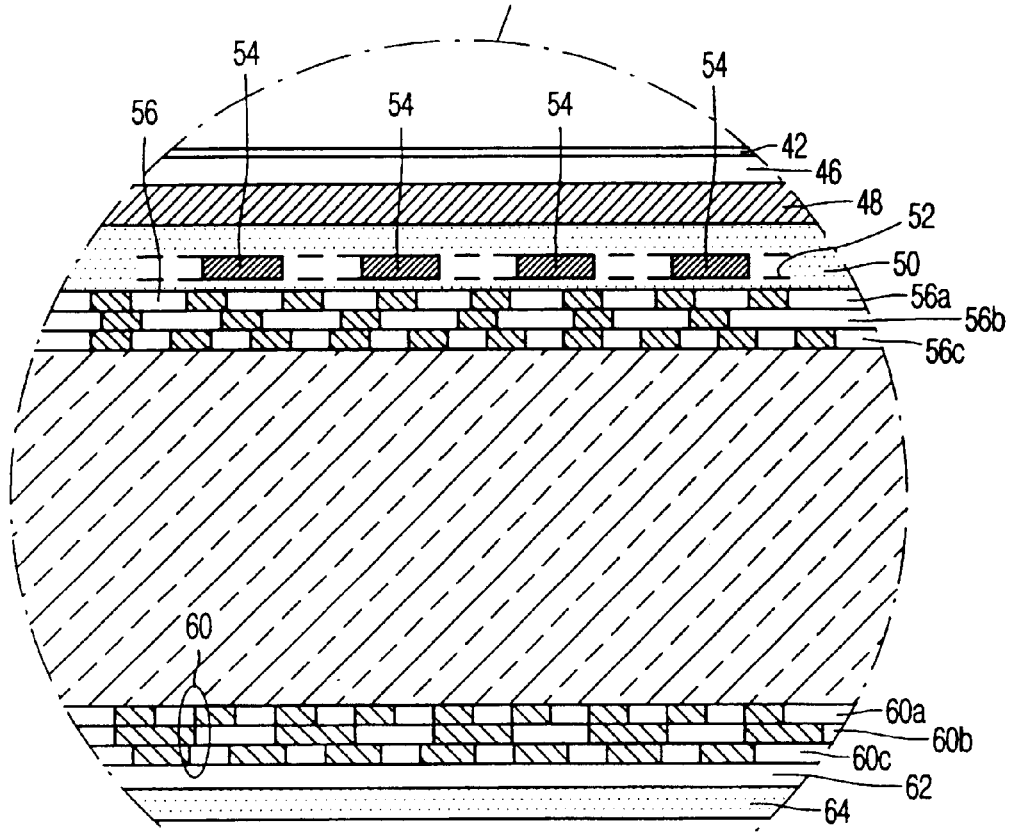

FIG. 2 shows the construction of the assembly of the gradient coil system 40 according to the invention, together with the housing 32 of the magnet system 1 which is diagrammatically shown in FIG. 1. The assembly has a rotationally symmetrical appearance with an axis of rotational symmetry 36. The Figure represents a sectional view taken in a plane through the axis 36, so that the overall assembly has a substantially annular shape. The housing 32 encloses a space 34 in which the coils for generating the uniform magnetic field B (not shown in this Figure) are accommodated. Such a system for generating the uniform magnetic field may be a superconducting system; in that case the space 34 is arranged to accommodate all elements required so as to maintain the required low temperatures, notably a vacuum vessel and radiation shields.

The gradient coil system 40 according to the invention is accommodated in a space 38 which adjoins the former space 34 and may be, if desirable, an evacuated space. The system 40, constituting a mechanically rigid unit, is attached to the partition 42 between the space 34 for the magnet system 1 and the space 38 for the gradient system 40; attachment is realized by means of fixing elements 44 so that the system 40 is resiliently mounted in such a manner that the vibrations produced therein are attenuated or damped to such an extent that any residual vibrations in the gradient system are not transferred to the surrounding construction or in a strongly suppressed manner only.

FIG. 2 also shows a detailed view in which the exact construction of the gradient coil system is represented in more detail. Said partition 42 may be made of stainless steel of a thickness of 2 mm. Between this partition 42 and the eddy current shield 48, having a thickness of 8 mm, there is formed a vacuum space 46 so that a distance of approximately 5 mm exists between the wall 42 and the eddy current shield 48. The system 40, constituting a mechanically rigid unit, consists of the elements 48–60. The layer 50 therein constitutes a mechanical supporting layer having a thickness of 15 mm, so that the desired mechanically rigid unit is realized. The layer 50, consisting of a fiberglass-reinforced polymer, is provided with cut-outs which extend in the direction of the axis 36 and accommodate ferromagnetic shim elements 54 for adjusting the main field in the imaging volume of the apparatus. The shim elements 54 are displaceable on rails provided in the cut-outs.

The conductors of the shielding coils 56 for actively shielding the space outside said coils from the magnetic field generated in said space by the primary gradient coils are provided on the inner side of the layer 50 and constitute one mechanical unit in conjunction therewith. These coils, being the x, y and z shielding coils 56a, 56b and 56c, respectively, together constitute a layer having a thickness of approximately 10 mm. For optimum operation of the actively shielded system a given distance is required between the primary gradient coils and the shielding coils. This distance is provided by an intermediate layer 58 of a thickness of 80 mm which also contributes to the mechanical strength and rigidity of the gradient system. The intermediate layer 58, consisting of a fiberglass-reinforced polymer, may be provided with ducts (not shown) for conducting cooling agents for discharging heat generated in the coil system 40. The conductors of the primary gradient coils 60 for generating the gradient field in the imaging volume 29 of the apparatus are provided on the inner side of the layer 58 and form one mechanical unit in conjunction therewith. These coils, being the x, y and z gradient coils 60a, 60b and 60c, respectively, together constitute a layer having a thickness of approximately 10 mm. The space 38 in which the gradient coil system 40 is accommodated is separated from the bore in which the patient to be imaged is positioned by means of a vacuumtight partition 64 which has a thickness of approximately 5 mm and is made of a fiberglass-reinforced polymer. A vacuum space 62, having a width of approximately 4 mm, is present between the partition 64 and the coil system 40. Due to the absence of an atmosphere surrounding the coil system 40, no acoustic vibrations are transferred so that the coil system 40 cannot cause a noise nuisance.

All references cited herein are incorporated herein by reference in their entirety and for all purposes to the same extent as if each individual publication or patent or patent application was specifically and individually indicated to be incorporated by reference in its entirety for all purposes.

What is claimed is:

1. A magnetic resonance imaging apparatus which includes a gradient system for generating a magnetic gradient field in an imaging volume of the apparatus, the gradient system comprising:

a primary gradient coil for generating the gradient field, a shielding coil for actively shielding the space outside the imaging volume from the magnetic field generated in said space by the primary gradient coil and, an eddy current shield which is formed by an electrically conductive, substantially closed plate, wherein the primary gradient coil and the shielding coil are arranged within the eddy current shield and constitute a mechanically rigid unit in conjunction therewith and wherein the time constant for eddy currents of the eddy current shield is greater than the pulse duration of the gradient current pulses driving the gradient system.

2. A magnetic resonance imaging apparatus as claimed in claim 1, wherein the eddy current shield is made of aluminium and/or copper.

3. The apparatus of claim 1 wherein a space exists between the shielding coil and the eddy current shield, ferromagnetic shim elements being arranged in said space in order to adjust the steady, uniform magnetic field in the imaging volume of the apparatus.

4. The apparatus of claim 1 wherein a space exists between the primary gradient coil and the shielding coil in said space there being provided a filler medium in which ducts are formed for conducting a cooling medium.

5. A magnetic resonance imaging apparatus which includes a gradient system for generating a magnetic gradient field in an imaging volume of the apparatus, the gradient system comprising:

a primary gradient coil for generating the gradient field, a shielding coil for actively shielding the space outside the imaging volume from the magnetic field generated in said space by the primary gradient coil and, an eddy current shield which is formed by an electrically conductive, substantially closed plate, wherein the primary gradient coil and the shielding coil are arranged within the eddy current shield and constitute a mechanically rigid unit in conjunction therewith and wherein a space exists between the shielding coil and the eddy current shield, ferromagnetic shim elements being arranged in said space in order to adjust the steady, uniform magnetic field in the imaging volume of the apparatus.

6. The apparatus of claim 5 wherein a space exists between the primary gradient coil and the shielding coil in said space there being provided a filler medium in which ducts are formed for conducting a cooling medium.

7. A magnetic resonance imaging apparatus which includes a gradient system for generating a magnetic gradient field in an imaging volume of the apparatus, the gradient system comprising:

a primary gradient coil for generating the gradient field, a shielding coil for actively shielding the space outside the imaging volume from the magnetic field generated in said space by the primary gradient coil and, an eddy current shield which is formed by an electrically conductive, substantially closed plate, wherein the primary gradient coil and the shielding coil are arranged within the eddy current shield and constitute a mechanically rigid unit in conjunction therewith and wherein a space exists between the primary gradient coil and the shielding coil, in said space there being provided a filler medium in which ducts are formed for conducting a cooling medium.

* * * * *